(12) United States Patent
Lee et al.

(10) Patent No.: US 8,288,656 B2
(45) Date of Patent: Oct. 16, 2012

(54) LOW TEMPERATURE CURABLE PHOTOSENSITIVE RESIN COMPOSITION AND DRY FILM MANUFACTURED BY USING THE SAME

(75) Inventors: Kwang-Joo Lee, Daejeon (KR);
Joo-Eun Ko, Daejeon (KR);
Byung-Nam Kim, Seoul (KR);
Heon-Sik Song, Daejeon (KR); You-Jin Kyung, Daejeon (KR); Hee-Jung Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 231 days.

(21) Appl. No.: 12/870,116

(22) Filed: Aug. 27, 2010

(65) Prior Publication Data
US 2011/0067907 A1 Mar. 24, 2011

(30) Foreign Application Priority Data
Aug. 28, 2009 (KR) .................. 10-2009-0080612

(51) Int. Cl.
*H05K 1/02* (2006.01)
*G03F 7/023* (2006.01)

(52) U.S. Cl. ........................... 174/256; 430/18
(58) Field of Classification Search .................. None
See application file for complete search history.

(56) References Cited

U.S. PATENT DOCUMENTS

| | | | |
|---|---|---|---|
| 5,858,584 A * | 1/1999 | Okabe et al. ..................... | 430/18 |
| 6,001,517 A * | 12/1999 | Kawamonzen .................. | 430/18 |
| 6,316,170 B2 | 11/2001 | Kawamonzen et al. | |
| 7,407,731 B2 * | 8/2008 | Naiini et al. ..................... | 430/18 |
| 7,635,551 B2 * | 12/2009 | Hasegawa et al. ............. | 430/192 |
| 7,771,559 B2 * | 8/2010 | Tsukagoshi et al. ........... | 156/327 |
| 2004/0235992 A1* | 11/2004 | Okada et al. .................. | 524/115 |
| 2010/0116532 A1* | 5/2010 | Funaki et al. .................. | 174/258 |

FOREIGN PATENT DOCUMENTS

| | | |
|---|---|---|
| JP | 11-279404 A | 10/1999 |
| JP | 2006-146244 A | 6/2006 |
| JP | 2009-091573 A | 4/2009 |
| KR | 10-2009-0019739 A | 2/2009 |

* cited by examiner

*Primary Examiner* — Gregory Thompson
(74) *Attorney, Agent, or Firm* — Rothwell, Figg, Ernst & Manbeck, P.C.

(57) ABSTRACT

The present invention provides a photosensitive resin composition comprising: a polyamic acid including a specific repeating unit; a heterocyclic amine compound; a (metha) acrylate-based compound including one or more double bonds between carbons; a photoinitiator; and an organic solvent, and a dry film prepared therefrom. The photosensitive resin composition can be cured at a low temperature to offer process safety and work convenience, and has excellent bending resistance, soldering heat resistance, and a property of filling the pattern, as well as excellent heat resistance and mechanical properties.

15 Claims, No Drawings

LOW TEMPERATURE CURABLE PHOTOSENSITIVE RESIN COMPOSITION AND DRY FILM MANUFACTURED BY USING THE SAME

CROSS REFERENCE TO RELATED APPLICATIONS

This application claims priority under 35 U.S.C. §119 to Korean Patent Application No. 10-2009-0080612 filed on Aug. 28, 2009, which is incorporated herein in its entirety.

TECHNICAL FIELD

The present invention relates to a photosensitive resin composition and a dry film prepared therefrom. More specifically, the present invention relates to a photosensitive resin composition that is curable at a low temperature to offer the process stability and operational convenience and that is excellent in heat resistance, mechanical properties, bending resistance, soldering heat resistance and a pattern-filling property etc, and to a dry film prepared from the photosensitive resin composition.

BACKGROUND ART

Since a polyimide and a precursor thereof have excellent durability, heat resistance, flame retardancy, and mechanical and electronic properties, they are frequently used as a base film of a printed circuit board, and a highly integrated semiconductor device or a cover film for highly integrated multi-layered circuit board.

Recently, a photosensitive protective film (photoimageable coverlay) for a circuit board has been used in a photolithography process in order to improve in providing a fine circuit pattern and a precise position. In order to be used for a photosensitive protective film for a circuit board, the photosensitive resin composition is required to satisfy certain necessary requirements such as excellent durability, flame retardancy, and mechanical and electronic properties.

In general, the photosensitive protective film for a circuit board is prepared by thermal compressing a liquid or film type of photosensitive resin composition on a circuit of a copper clad laminate (CCL), exposing it to UV along the pattern, developing it with a developing agent, washing, drying, and then performing thermal curing. Then, fine holes required to connect a circuit can be formed precisely at a desired position.

The photosensitive resin composition used for a conventional dry film and the like has been obtained by adding an acrylate to an epoxy resin. However, such resin can be discolored or delaminated from the circuit in a soldering process due to poor flame retardancy and poor soldering heat resistance of the cured resin. Additionally, the resin composition is not suitable for a protective film of the circuit board because its insufficient flexibility and bending resistance easily cause cracks in repeated foldings.

To solve these problems, there is a large need for a polyimide photosensitive resin that has been used as a conventional protective film for circuit pattern and that has high heat resistance, bending resistance, and a good dielectric property. However, the most serious obstacle in using the photosensitive polyimide resin for a photosensitive protecting film of a circuit board is that it is exposed to a high temperature process.

In application of the polyimide photosensitive resin, a polyamic acid, which is a precursor of a polyimide, is used so as to increase the formability and easily express the photosensitivity. However, polyimidization of the polyamic acid requires a curing process that is normally carried out at 300~350° C. or higher, or at least 250° C.

In the process of preparing a printed circuit board (PCB), the protective film is coated or laminated on a patterned copper circuit at 200° C. or lower because of oxidization and deterioration of the copper circuit. The polyamic acid that requires a high temperature curing process at 250□° C. or higher, has a limit in application in a process of preparing a PCB. Therefore, there is a need for a new method for lowering the temperature for curing the polyamic acid.

DISCLOSURE OF INVENTION

Technical Problems

The present invention provides a photosensitive resin composition curable at a low temperature, which to offers the process stability and operational convenience, and has excellent bending resistance, soldering heat resistance and a pattern-filling property as well as excellent heat resistance and mechanical properties.

In addition, the present invention provides a dry film from the photosensitive resin composition.

Technical Solutions

The present invention provides a photosensitive resin composition comprising a polyamic acid containing a repeating unit of a certain chemical structure, heterocyclic amine compound, a (metha)acrylate-based compound, a photoinitiator and an organic solvent.

In addition, the present invention provides a dry film comprising a cured resin product of the photosensitive resin composition.

Further, the present invention provides a multilayered print wiring board, flexible circuit board, soft circuit board and a laminate body for a semiconductor, which comprise the dry film.

Hereinafter, the photosensitive resin composition, the dry film and the multilayered circuit board comprising a cured product prepared therefrom according to specific embodiments will be described in more detail.

In accordance with an embodiment of the present invention, a photosensitive resin composition is provided that comprises: a polyamic acid containing a repeating unit represented by Chemical Formula 1; a heterocyclic amine compound selected from the group consisting of pyridine, triazole, imidazole, quinoline, and triazine, which are unsubstituted or substituted by at least one functional group selected from the group consisting of an alkyl group, a hydroxyl group, and an oxime-derivative group; a (metha)acrylate-based compound including one or more double bonds between carbons; a photoinitiator; and an organic solvent.

[Chemical Formula 1]

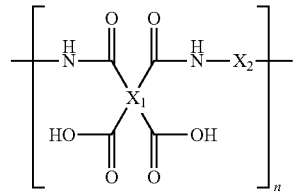

In Chemical Formula 1, X1 may be a tetravalent organic group, and X2 may be a divalent organic group including an aromatic ring.

The present inventor completed the present invention after finding that the curing temperature of a photosensitive resin composition can be lowered to 200° or lower by using a mixture of a polyamic acid comprising a specific repeating unit, a specific heterocyclic amine compound, and a (metha) acrylate-based compound, which provides the process stability and operational convenience, excellent properties such as a developing property bending resistance and photosensitivity of the resin, an improvement in filling an uneven pattern can be achieved due to improved fluidity.

The heterocyclic amine compound may comprise pyridine, triazole, imidazole, quinoline, and triazine, which are unsubstituted or substituted by at least one functional group selected from the group consisting of a C1-C10 alkyl group, hydroxyl group, and aldoxime-derivative group. Using the heterocyclic amine compound in a photosensitive resin composition can accelerate the curing process and enable the curing process to be performed at 200° C. or lower. Preferably, the heterocyclic amine compound may be a heterocyclic aromatic amine compound, such as pyridine, triazole, imidazole, quinoline, and triazine, which may be unsubstituted or substituted by the above functional group.

The heterocyclic amine compound is differentiated from a previously used compound having a mercapto group. Because of the properties of the mercapto group, the compound substituted with a mercapto group requires a relatively high temperature for curing. The mercapto group functions to increase adhesiveness of the polymer resin used in a dry film. The compound substituted with the mercapto group used in the conventional art has no significant effect on the polyimidization of polyamic acid, and thus cannot lower the curing temperature. By contrast, the heterocyclic amine compound disclosed herein accelerates the polyimidization of polyamic acid, and thus allows the photosensitive resin composition to be readily cured.

Meanwhile, in Chemical Formula 1, X1 is any tetravalent organic group, and preferably, can be a tetravalent organic group selected from the group consisting of organic groups represented by Chemical Formula 3 to 15.

[Chemical Formula 3]

[Chemical Formula 4]

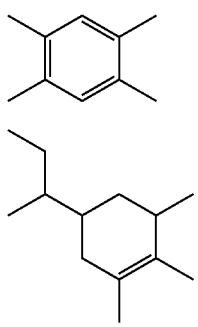

[Chemical Formula 5]

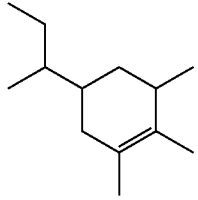

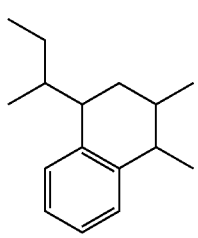

[Chemical Formula 6]

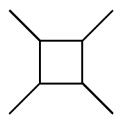

[Chemical Formula 7]

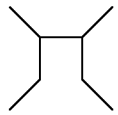

[Chemical Formula 8]

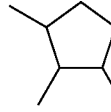

[Chemical Formula 9]

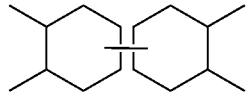

[Chemical Formula 10]

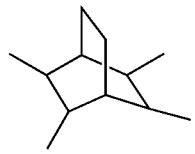

[Chemical Formula 11]

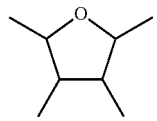

[Chemical Formula 12]

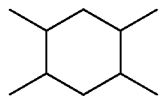

[Chemical Formula 13]

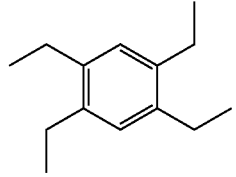

[Chemical Formula 14]

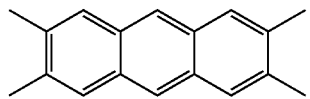

[Chemical Formula 15]

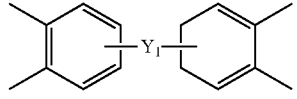

In Chemical Formula 15, Y1 is a single bond, —O—, —CO—, —S—, —SO2-, —C(CH3)2-, —C(CF3)2-, —CONN, —(CH2)n1-, —O(CH2)n2O—, or —COO(CH2)n3OCO—, and n1, n2, and n3 are each independently an integer of 1 to 5.

In Chemical Formula 1, X2 is any divalent organic group including an aromatic ring, and preferably, can be a divalent organic group selected from the groups represented by Chemical Formula 16 to 19.

[Chemical Formula 16]

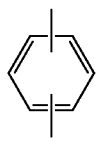

[Chemical Formula 17]

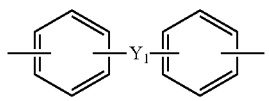

[Chemical Formula 18]

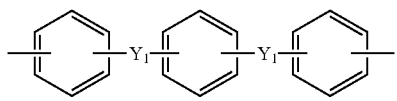

[Chemical Formula 19]

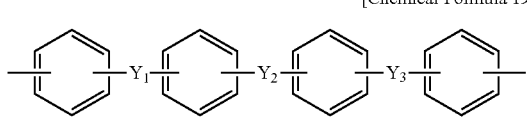

In Chemical Formula 17 to 19, Y1, Y2, and Y3 are the same or different, and are each independently a single bond, —O—, —CO—, —S—, —SO2-, —C(CH3)2-, —C(CF3)2-, —CONH, —(CH$_2$)$_n$1-, —O(CH2)n2O—, or —COO(CH2)n3OCO—, and n1, n2, and n3 are each independently an integer of 1 to 5.

The polyamic acid comprising the repeating unit represented by Chemical Formula 1 can be obtained by reacting at least two kinds of diamine compounds comprising an aromatic ring and at least one acid dianhydride comprising an aromatic ring. For example, the polyamic acid comprising the repeating unit represented by Chemical Formula 1 may be obtained by reacting at least two kinds of diamine compounds represented by the following Chemical Formula 30 and at least one kind of acid anhydride represented by Chemical Formula 31 and 32.

H$_2$N—X$_2$—NH$_2$   Chemical Formula 30

In Chemical Formula 30, X2 is the same as in Chemical Formula 1.

Specific examples of the diamine compounds can be at least two compounds selected from the group consisting of p-phenylenediamine (p-PDA), m-phenylenediamine (m-PDA), 4,4'-oxydianiline(4,4'-ODA), 3,4'-oxydianiline(3,4'-ODA), 2,2-bis-(4-[4-aminophenoxy]-phenyl)propane (BAPP), 1,3-bis-(4-aminophenoxy)benzene (TPE-R),1,4-bis-(4-aminophenoxy)benzene (TPE-Q), 2,2-bis-(4-[3-aminophenoxy]phenyl)sulfone(m-BAPS), and the like, but the examples are not limited thereto.

[Chemical Formula 31]

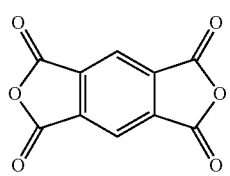

[Chemical Formula 32]

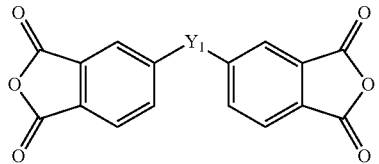

In Chemical Formula 32, Y1 is a single bond, —O—, —CO—, —S—, —SO2-, —C(CH3)2-, —C(CF3)2-, —CONH, —(CH$_2$)$_n$1-, —O(CH2)n2O—, or —COO(CH$_2$)$_n$3OCO—, and n1, n2, and n3 are each independently an integer of 1 to 5.

Examples of the acid dianhydrides comprise at least one selected from the group consisting of pyromelitic dianhydride, 3,3'-4,4'-biphenyltetracarboxylic dianhydride, 3,3',4,4'-benzophenone tetracarboxylic dianhydride, 4,4'-oxydiphthalic anhydride, 4,4'-(4,4'-isopropylbiphenoxy)biphthalic anhydride), 2,2'-bis-(3,4-dicarboxylphenyl)hexafluoropropane dianhydride, ethylene glycol bis-(anhydro-trimellitate (TMEG), and the like, but the examples are not limited thereto.

The polyamic acid may be produced by using an organic synthesis method that is known in the art. For example, the polyamic acid may be produced by sequentially dissolving one or more diamine compounds that are represented by Chemical Formula 30 in a solvent, adding one or more acid dianhydride compounds that are represented by Chemical Formula 31 or Chemical Formula 32, and reacting them. It is preferable that the reaction of the diamine compound and the acid dianhydride compound starts at a temperature in the range of from 0 to 5° C. and is generally performed for 24 hours or so until the reaction is completed at a temperature in the range of from 10 to 40° C. At this time, it is preferable that the diamine compound and the acid dianhydride compound are mixed with each other at a molar ratio of from 1:0.9 to 1:1.1. If the molar ratio of the diamine compound and the acid dianhydride compound is less than 1:0.9, the molecular weight thereof becomes very low, and thus it may be difficult to prepare polyimide that has excellent mechanical properties. On the contrary, if the molar ratio of the diamine compound and the acid dianhydride compound is more than 1:1.1, since the viscosity is very high, processes that are required in coating and operation may be difficult.

The solvent used for preparing the polyamic acid may be at least one selected from the group consisting of N-methylpyrrolidinone (NMP), N,N-dimethylacetamide (DMAc), tetrahydrofuran (THF), N,N-dimethylformamide (DMF), dimethylsulfoxide (DMSO), cyclohexane, acetonitrile, and a mixture thereof, but is not limited thereto.

The number average molecular weight (Mn) of the polyamic acid is preferably in the range of 2000 to 300,000, and more preferably 8000 to 20,000. If Mn of the polyamic acid is less than 2000, since the viscosity of the composition comprising the polyamic acid becomes low, coating or physical properties of the photosensitive resin composition may become poor. In addition, if Mn of the polyamic acid is more than 300,000, it is difficult to handle the polyamic acid due to too high viscosity of the photosensitive resin composition.

A polyimide comprising a repeating unit represented by Chemical Formula 2 can be prepared from polyamic acid comprising a repeating unit represented by Chemical Formula 1. Examples of imidization of polyamic acid include chemical imidization in which acetic acid anhydride and pyrimidine are added to the polyamic acid and then the mixture is heated at from 50 to 100° C., and thermal imidization in which a polyamic acid solution is coated on a substrate and then the coated substrate is put in an oven or on a hot plate at from 100 to 250° C.

[Chemical Formula 2]

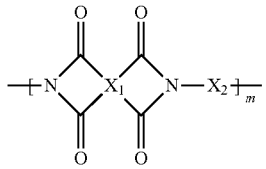

In Chemical Formula 2, X1 and X2 are as defined in Chemical Formula 1.

As described above, the examples of the heterocyclic amine compound can be heterocyclic aromatic amines comprising pyridine, triazole, imidazole, quinoline, and triazine that are unsubstituted or substituted by at least one functional group selected from the group consisting of an alkyl group, a hydroxyl group, and an oxime-derivative group, and preferably comprising pyridine, triazole, imidazole, quinoline, and triazine that are unsubstituted or substituted by at least one functional group selected from the group consisting of a C1-C10 alkyl group, a hydroxyl group, and an aldoxime-derivative group. An aliphatic primary amine or a secondary amine cannot achieve sufficient acceleration of curing or can react with the main chain of polyamic acid to cause a gelling reaction. By contrast, the heterocyclic aromatic amines show an excellent curing accelerating effect, and cause the curing process be performed at 200° C. or lower.

The oxime or aldoxime derivative groups refer to a functional group derived from oxime or aldoxime, respectively. The aldoxime derivative group can comprise a functional group represented by Chemical Formula 33:

[Chemical Formula 33]

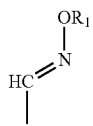

In Chemical Formula 33, R1 may be hydrogen, a C1 to C10 alkyl, or a C7-C15 phenylalkyl.

The heterocyclic amine can be contained at an amount of 0.5 to 30 parts by weight, or preferably 5 to 15 parts by weight, based on 100 parts by weight of the polyamic acid. If the amount of heterocyclic amine is less than 0.5 part by weight, the desired curing degree cannot be achieved. If it exceeds 30 parts by weight, it causes decrease in strength of the film after curing.

The photosensitive resin composition may comprise the (metha)acrylate-based compound including one or more double bonds between carbons. The (metha)acrylate-based compound is highly compatible with polyamic acid and is used to make a negative pattern after UV exposure.

Herein, the term "(metha)acrylate" is intended to include both "methacrylate" and "acrylate".

The (metha)acrylate-based compound comprising a double bond between carbons can be used in an amount of 5 to 200 parts by weight, based on 100 parts by weight of the polyamic acid. If the (metha)acrylate-based compound is comprised at less than 5 parts by weight, the developing property is reduced. If it is more than 200 parts by weight, the mechanical properties such as heat resistance and flexibility can be deteriorated.

Examples of the (metha)acrylate-based compound are 2-hydroxyethyl(metha)acrylate, benzyl(metha)acrylate, phenoxypolyethylene(metha)acrylate, methoxylpolypropyleneglycol(metha)acrylate, 2-hydroxypropyl(metha)acrylate, (metha)acryloyloxyethylhydrogenphthalate, 1,6-hexandioldi(metha)acrylate, ethandioldi(metha)acrylate, methylenebis(metha)acrylate, neopentylglycoldi(metha)acrylate, 2-hydroxypropandioldi(metha)acrylate, isopropyldioldi(metha)acrylate, isopropyleneglycoldi(metha)acrylate, 2-hydroxyethyl methacrylate(HEMA), phenylglycidylester acrylate (Kayarad R-128H), 1,6-hexanediol epoxy acrylate (Kayarad R-167), Ebecryl 9695 (epoxy acrylate oligomer diluted with carbitol acetate) and glycidyl(metha)acrylate, but are not limited thereto. The (metha)acrylate-based compound can be used alone or in combination of at least two kinds of them.

The photosensitive resin composition may comprise the photoinitiator. Examples of the photoinitiator are an acetophenone-based compound such as 2-hydroxy-2-methyl-1-phenylpropane-1-on, 1-(4-isopropylphenyl)-2-hydroxy-2-methylpropane-1-on, 4-(2-hydroxyethoxy)-phenyl-(2-hydroxy-2-propyl)ketone, 1-hydroxycyclohexylphenylketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propane-1-on, 2-benzyl-2-dimethylamino-1-(4-morpholinophenyl)-butane-1-on, 2-methyl-1-[4-(methylthio)phenyl]-2-morpholinopropane-1-on, and the like; a biimidazole-based compound such as 2,2-bis-(2-chlorophenyl)-4,4',5,5'-tetraphenyl biimidazole, 2,2'-bis-(o-chlorophenyl)-4,4',5,5'-tetrakis(3,4,5-trimethoxyphenyl)-1,2'-biimidazole, 2,2'-bis-(2,3-dichlorophenyl)-4,4',5,5'-tetraphenyl 2,2'-bis-(o-chlorophenyl)-4,4',5,5'-tetraphenyl-1,2'-biimidazole, and the like; a triazine-based compound such as 3-{4-[2,4-bis-(trichloromethyl)-s-triazine-6-yl]phenylthio}propionic acid, 1,1,1,3,3,3-hexafluoroisopropyl-3-{4-[2,4-bis-(trichloromethyl)-s-triazine-1-6-yl]phenylthio}propionate, ethyl-2-{4-[2,4-bis-(trichloromethyl)-s-triazine-6-yl]phenylthio}acetate, 2-epoxyethyl-2-{-4-[2,4-bis-(trichloromethyl)-s-triazine-6-yl]phenylthio}acetate, cyclohexyl-2-{4-[2,4-bis-(trichloromethyl)-s-triazine-6-yl]phenylthi-o}acetate, benzyl-2-{4-[2,4-bis-(trichloromethyl)-s-triazine-6-yl]phenylthi-o}acetate, 3-{chloro-4-[2,4-bis-(trichloromethyl-s-triazine-6-yl]phenylthio-}propionic acid, 3-{-4-[2,4-bis-(trichloromethyl-s-triazine-6-yl]phenylthio}propionamide, 2,4-bis-(trichloromethyl)-6-p-methoxystyryl-s-triazine, 2,4-bis-(trichloromethyl)-6-(1-p-dimethylaminophenyl)-1,3-butadienyl-s-tri-azine, 2-trichloromethyl-4-amino-6-p-methoxystyryl-s-triazine, and the like; and an oxime-based compound such as CGI-242 and CGI-124 manufactured by Chiba, Co., Ltd. in Japan. However, the photoinitiator cannot be limited to the examples.

The photoinitiator can be used in the range of 0.3 to 10 parts by weight on the basis of the 100 parts by weight of the polyamic acid of the photosensitive resin composition. If the amount of the photoinitiator is less than 0.3 parts by weight, the photocuring participation of the (metha)acrylate-based compound including one or more double bonds between carbons is decreased. If it is more than 50 parts by weight, radicals that do not participate in the curing, may reduce the physical properties of the film that is produced from the photosensitive resin.

The organic solvent can be any solvent in which polyamic acid, a heterocyclic amine, the (metha)acrylate-based compound including one or more double bonds between carbons, and the photoinitiator can be easily dissolved, and that can easily dried in the coating process. The organic solvent can be contained in an amount of 300 to 700 parts by weight, based on 100 parts by weight of the polyamic acid.

The organic solvent can preferably be a polar aprotic organic solvent considering solubility. Specific examples of the organic solvent comprise at least one selected from the group consisting of N-methyl-2-pyrrolidone, N-acetyl-2-pyrrolidone, N-benzyl-2-pyrrolidone, N,N-dimethylformamide, N,N-dimethylacetamide, dimethylsulfoxide, hexanemethylphosphortriamide, N-acetyl-∈-caprolactam, dimethylimidazolidoneimidazolidinone, diethyleneglycoldimethylether, triethyleneglycoldimethylether, γ-butyrolactone, dioxane, dioxolane, tetrahydrofuran, chloroform, and chloromethylene, but are not limited thereto.

In addition, the photosensitive resin composition can comprise an additive such as a photocrosslinking sensitizer, a curing accelerator, a phosphorus-based flame retardant, a defoaming agent, a leveling agent, and an anti-gelling agent, on an as-need basis.

In another embodiment of the present invention, a dry film comprising a cured resin product of the photosensitive resin composition is provided.

The dry film may be prepared by coating the photosensitive resin composition on a support and drying using a known method. The photosensitive resin composition layer can be delaminated from the support, and preferably the support has excellent optical permeability. In addition, it is preferable that the support provides good flatness.

As specific examples of the support, there may be various plastic films such as polyethylene terephthalate, polyethylene naphthalate, polypropylene, polyethylene, cellulose tri-acetate, cellulose di-acetate, poly(metha)acrylic acid alkyl ester, a poly(metha)acrylic acid ester copolymer, polyvinyl chloride, polyvinyl alcohol, polycarbonate, polystyrene, cellophane, a polyvinyl chloridene copolymer, polyamide, polyimide, a vinyl chloride vinyl acetate copolymer, polytetrafluoroethylene, polytrifluoroethylene, and the like. In addition, a combination material consisting of two or more plastic films thereof may be used, and the polyethylene terephthalate film having excellent optical permeability is particularly preferable. The thickness of the support is preferably in the range of 5 to 150 μm, and more preferably 10 to 50 μm.

The coating method of the photosensitive resin composition is not particularly limited, and for example, methods such as a spray method, a roll coating method, a rotation coating method, a slit coating method, a compression coating method, a curtain coating method, a die coating method, a wire bar coating method, and a knife coating method may be used. Drying of the photosensitive resin composition varies according to the components, the organic solvent, and the content ratio, but it is preferable that drying is carried out at 60 to 100° C. for 30 sec to 15 min.

The thickness of the dry film produced by coating the photosensitive resin composition on the support and drying and curing it, is in the range of preferably 5 to 95 μm and more preferably 10 to 50 μm. If the film thickness of the dry film is less than 5 μm, the insulating property is not good, and if the film thickness is more than 95 μm, the resolution may be decreased.

The dry film can be used as a cover film for a semiconductor device or for a multilayered wiring board, or as a polyimide cover film (PICL). According to another embodiment of the present invention, a multilayered print wiring board or a flexible circuit board comprising the dry film is provided.

Taking the multilayered print wiring board or flexible circuit board as an example, the photosensitive coating film may be formed through a vacuum lamination method at 60 to 90° C. after pre-laminating the dry film with a plane compression method or a roll compression method on a circuit-formed surface at a temperature in the range of 25 to 50° C. The pattern may be formed by exposing the dry film using a photomask in order to form a fine hole or a fine width line. The amount of UV exposure varies the kind of light source and the thickness of the film used, depending on, but in general, the exposure amount is preferably in the range of 100 to 1,200 mJ/cm$^2$, and more preferably 100 to 400 mJ/cm$^2$. Electronic rays, ultraviolet(UV) rays, X-rays, and the like, can be used as active rays, and preferably the UV rays may be used. A high pressure mercury lamp, a low pressure mercury lamp, a halogen lamp, and the like may be used as a light source.

For developing after the exposure, a dipping method is generally used to dip it in a developing solution. An alkalin aqueous solution such as a sodium hydroxide aqueous solution and a sodium carbonate aqueous solution is used as the developing solution. After the development by using the alkalin aqueous solution water washing is performed. Then, along the pattern obtained by the development through a heat treatment process, the polyamic acid is changed into polyimide. Preferably, the temperature required in the heat treatment is in the range of 150 to 230° C. that is required for imidization. At this time, it is more effective to increase the heating temperature continuously through 2 to 4 steps using an appropriate temperature profile, but in some cases, the curing may be carried out at a constant temperature. By carrying out the above process, the multilayered print wiring board and the flexible circuit board can be obtained.

Another embodiment of the present invention also may provide a flexible circuit board or a laminate body for a semiconductor, which comprises the dry film. The dry film can be used as a protective film or an interlayer insulating film in the flexible circuit board or the laminate body for a semiconductor.

As the composition and the production method of the printed circuit board or the laminate body for a semiconductor, a commonly known technology in the art may be used, except that the dry film according to the present invention is used as a protective film or an interlayer insulating film.

Effects of the Present Invention

According to the embodiments of the present invention, there are provided photosensitive resin compositions curable at a low temperature, which provides the process stability and operational convenience and that is excellent in heat resistance, mechanical properties, bending resistance, soldering heat resistance and a pattern-filling property etc, and to a dry film prepared from the photosensitive resin composition; a multilayered print wiring board, flexible circuit board, soft circuit board and a laminate body for a semiconductor, which comprise the dry film

WORKING EXAMPLES OF THE INVENTION

The invention is further explained in more detail with reference to the following examples. These examples, however, should not be interpreted as limiting the scope of the invention in any manner.

Preparation Example

Preparation of Polyamic Acid(PAA1)

While nitrogen flowed into a four-neck round bottom flask installed with a thermometer, an agitator, a nitrogen input port, and a powder dispensing funnel, 780 g of N,N-dimethyl acetamide (DMAc) was added to 23.24 g of 4,4'-oxydianiline (4,4'-ODA) and 106.84 g of 1,3-bis-(4-aminophenoxy)benzene (TPE-R)), and was agitated to completely dissolve it. The solution was cooled to 15° C. or lower, and agitated while 106.15 g of 3,3',4,4'-biphenyltetracarboxylic dianhydride(B-PDA) was slowly added to obtain a polyamic acid varnish.

Example

Preparation of Photosensitive Resin Composition

Example 1

10 parts by weight of 1,3,4-1H-triazole as a heterocyclic amine compound, 15 parts by weight of A-BPE-20 (Daiich Chem) as a (metha)acrylate-based compound having one or more double bonds between carbons, 15 parts by weight of Kayarad R-128H (Nippon Kayaku), and a mixture of 0.3 parts by weight of Igacure 651 and 0.2 parts by weight of Igacure 369 as a photoinitiator were added to 100 parts by weight of polyamic acid varnish obtained in Preparation Example 1, and mixed to produce a photosensitive resin composition.

After the photosensitive resin composition was coated on a PET film by using the doctor blade to having a coating thickness of 80 μm, it was dried at 80° C. in an oven for 10 min to obtain a dry film having a thickness of 25 μm.

Example 2

The dry film was prepared according to the same method of Example 1, except that 10 parts by weight of 3-hydroxy pyridine as a heterocyclic amine compound was used, based on 100 parts by weight of the polyamic acid varnish obtained in Preparation Example 1.

Example 3

The dry film was prepared according to the same method of Example 1, except that 10 parts by weight of 4-hydroxy pyridine as a heterocyclic amine compound was used, based on 100 parts by weight of polyamic acid varnish obtained in Preparation Example 1.

Example 4

The dry film was prepared according to the same method of Example 1, except that 10 parts by weight of isonicotinaldehyde O-benzyloxime as a heterocyclic amine compound was used, based on 100 parts by weight of polyamic acid varnish obtained in Preparation Example 1.

Example 5

The dry film was prepared according to the same method of Example 1, except that 10 parts by weight of imidazole as a heterocyclic amine compound was used, based on 100 parts by weight of polyamic acid varnish obtained in Preparation Example 1.

Example 6

The dry film was prepared according to the same method of Example 1, except that 10 parts by weight of 1-methyl imidazole as a heterocyclic amine compound was used, based on 100 parts by weight of polyamic acid varnish obtained in Preparation Example 1.

Comparative Example 1

The photosensitive resin composition and the dry film were prepared by the same method of Example 1, except that 10 parts by weight of 1,3,4-triazole was not used.

Comparative Example 2

The photosensitive resin composition and the dry film were prepared according to the same method of Example 1, except that 10 parts by weight of triethylamine was used instead of 10 parts by weight of 1,3,4-triazole.

Comparative Example 2

The photosensitive resin composition and the dry film were prepared according to the same method of Example 1, except that 10 parts by weight of 1,8-diazobicyclo[5,4,0]onde-7-in (DBU) was used instead of 10 parts by weight of 1,3,4-triazole.

Comparative Example 3

The photosensitive resin composition and the dry film were prepared according to the same method of Example 1, except that 10 parts by weight of cyclohexyl amine (CHA) was used instead of 10 parts by weight of 1,3,4-triazole.

Comparative Example 4

The photosensitive resin composition and the dry film were prepared according to the same method of Example 1, except that 10 parts by weight of 1,8-diazobicyclo[5,4,0]onde-7-in (DBU) was used instead of 10 parts by weight of 1,3,4-triazole.

Comparative Example 5

The photosensitive resin composition and the dry film were prepared according to the same method of Example 1, except that 10 parts by weight of 1,4-diazobicyclo[2,2,2]octane (DABCO) was used instead of 10 parts by weight of 1,3,4-triazole.

Experimental Example 1

Measurement of Physicochemical Properties of Photosensitive Dry Film

The dry films obtained in Examples 1 to 5 and in Comparative Examples 1 to 5 were put on a patterned copper laminate of 2 Copper Clad Laminate product, subjected to a vacuum lamination at 70° C. for 30 seconds, and cured in an oven at 180° C. in a nitrogen atmosphere for 1 hour. Then, the properties of the products were measured by the following measuring methods, and the results are presented in Table 1.

Experimental Example 1

Film Discoloration

The discoloration of the dry film was evaluated by the naked eye.

Experimental Example 2

Curing Degree of Polyimide

A poly-imidization rate of polyimide was measured by diamond attenuated total reflection Fourier transform infrared spectroscopy (ATR FT-IR). The rate of decreasing N—H bond in polyamic acid was compared with that of a specimen cured under a standard-cure condition and the numerical value was obtained.

Experimental Example 3

Developing Property

The produced dry film was subjected to the vacuum lamination on the copper clad, exposed at 350 mJ/cm$^2$, and subjected to a spray development by using 1 wt % sodium carbonate aqueous solution at 35° C., and whether the development using the pitch of L/S=50 μm/50 μm was tested.

Experimental Example 4

Adhesion Strength

The cross cut fill of the cured dry film was measured according to JIS K5404. Specifically, the cured dry film was cut in a lattice shape where the size of each lattice was 100 um), and a tape (NICHIBANG) was attached. After detaching the tape, the adhesion strength was evaluated by counting the number of lattices of the photosensitive resin film that were detached along with the tape.

Experimental Example 5

Soldering Heat Resistance

The dry film was floated in a solder pot at 288±5° C. for 1 minute while the dry film surface was arranged upward. Then, aberrations of the dry film were detected by eye inspection.

Experimental Example 6

Bending Resistance

On the FCCL pattern of L/S=100 μm/100 μm, the dry film was laminated under vacuum, exposed, developed, and cured, and the bending resistance was measured by using the MIT method (0.38R, 500 g load) (JIS C6471).

Experimental Example 7

Dielectric Constant

The dielectric constants of the dry films obtained in the examples and comparative examples were measured with an HP 4194A IMPEDENCE/GAIN-PHASE ANALYZER according to the method of ASTM D150.

TABLE 1

| | Experimental Result | | | | | | |
|---|---|---|---|---|---|---|---|
| | Film Discoloration | Film curing degree (%) | Developing property | Adhesion strength | Soldering heat resistance | Bending resistance | Dielectric constant |
| Example 1 | no | 100 | 50/50(able) | 100/100 | normal | 380 | 3.5 |
| Example 2 | no | 100 | 50/50(able) | 100/100 | normal | 420 | 3.5 |
| Example 3 | no | 100 | 50/50(able) | 100/100 | normal | 360 | 3.5 |
| Example 4 | no | 100 | 50/50(able) | 100/100 | normal | 400 | 3.5 |
| Example 5 | no | 100 | 50/50(able) | 100/100 | normal | 410 | 3.5 |
| Example 6 | no | 100 | 50/50(able) | 100/100 | normal | 430 | 3.5 |
| Comp. Example 1 | no | 80 | 50/50(able) | 100/100 | normal | 330 | 3.8 |
| Comp. Example 2 | no | 90 | 50/50(able) | 100/100 | normal | 350 | 3.7 |
| Comp. Example 3 | Discolored (brown) | 95 | 50/50(able) | 97/100 | Detach | 280 | 3.6 |
| Comp. Example 4 | no | 85 | 50/50(able) | 95/100 | Detach | 260 | 3.8 |
| Comp. Example 5 | no | 80 | 50/50(unable) | 80/100 | Detach | 295 | 3.8 |

As shown in Table 1, the curing degree of the dry films obtained in the examples was 100%. However, the curing degree of the dry film obtained in the comparative examples was 95% or lower, which confirmed that it was difficult to be cured at 180° C.

In addition, while the dry films of the examples did not show discoloration after heat-curing, that of Comparative Example 3 was changed to a brown color, and the dry film of Comparative Example 5 showed a poor developing property.

The dry films of the examples had excellent adhesiveness and thus were hardly detached. On the other hand, the dry films of the comparative examples showed relatively low adhesiveness due to the low curing degree.

Also, the dry films of the examples did not have aberrations after being floated in solder pot at 288±5° C. for 1 minute due to excellent soldering heat resistance. The dry films of the comparative examples showed the detaching phenomenon and thus were confirmed to have low soldering heat resistance.

What is claimed is:

1. A photosensitive resin composition comprising:
   a polyamic acid comprising a repeating unit represented by Chemical Formula 1;
   a heterocyclic amine compound selected from the group consisting of pyridine, triazole, imidazole, quinoline, and triazine that are unsubstituted or substituted with at least one functional group selected from the group consisting of an alkyl group, a hydroxyl group, and an oxime-derivative group;
   a (metha)acrylate-based compound containing one or more double bonds between carbons;
   a photoinitiator; and
   an organic solvent:

Chemical Formula 1

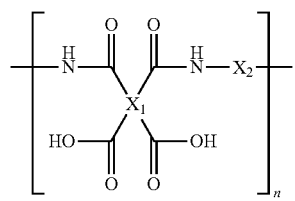

wherein, in Chemical Formula 1, $X_1$ is a tetravalent organic group, and $X_2$ is a divalent organic group containing an aromatic ring.

2. The photosensitive resin composition of claim 1, wherein $X_1$ is a tetravalent organic group selected from the groups represented by Chemical Formula 3 to 15:

Chemical Formula 3

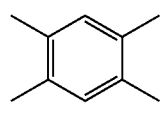

Chemical Formula 4

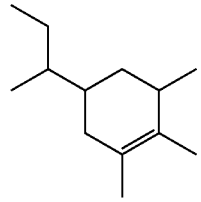

Chemical Formula 5

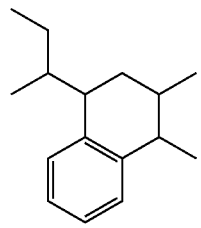

Chemical Formula 6

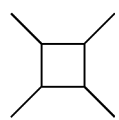

Chemical Formula 7

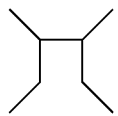

Chemical Formula 8

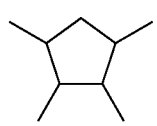

Chemical Formula 9

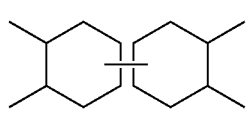

Chemical Formula 10

Chemical Formula 11

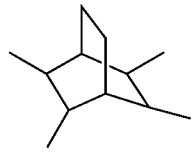

Chemical Formula 12

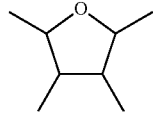

Chemical Formula 13

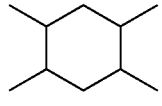

Chemical Formula 14

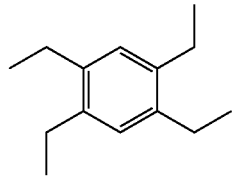

Chemical Formula 15

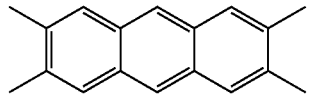

wherein, in Chemical Formula 15, $Y_1$ is a single bond, —O—, —CO—, —S—, —SO$_2$—, —C(CH$_3$)$_2$—, —C(CF$_3$)$_2$—, —CONH, —(CH$_2$)$_{n1}$—, —O(CH$_2$)$_{n2}$O—, or —COO(CH$_2$)$_{n3}$OCO—, and n1, n2, and n3 are each independently an integer of 1 to 5.

3. The photosensitive resin composition of claim 1, wherein $X_2$ is a divalent organic group selected from the groups represented by Chemical Formula 16 to 19:

Chemical Formula 16

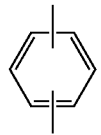

-continued

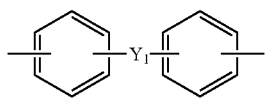

Chemical Formula 17

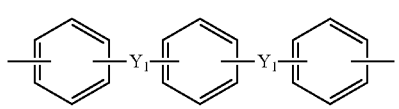

Chemical Formula 18

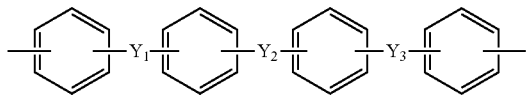

Chemical Formula 19 wherein, in Chemical Formulae 17 to 19, $Y_1$, $Y_2$, and $Y_3$ are different or the same, and are each independently a single bond, —O—, —CO—, —S—, —SO$_2$—, —C(CH$_3$)$_2$—, —C(CF$_3$)$_2$—, —CONH, —O(CH$_2$)$_{n2}$O—, or —COO(CH$_2$)$_n$OCO—, and n1, n2, and n3 are independently an integer of 1 to 5.

4. The photosensitive resin composition of claim 1, wherein the polyamic acid has a number-average molecular weight of 2,000 to 300,000.

5. The photosensitive resin composition of claim 1, wherein the (metha)acrylate-based compound containing one or more double bonds between carbons is at least one selected from the group consisting of 2-hydroxyethyl(metha)acrylate, benzyl(metha)acrylate, phenoxypolyethylene(metha)acrylate, methoxylpolypropyleneglycol(metha)acrylate, 2-hydroxypropyl(metha)acrylate, (metha)acryloyloxyethylhydrogenphthalate, 1,6-hexandioldi(metha)acrylate, ethandioldi(metha)acrylate, methylenebis-(metha)acrylate, neopentylglycol di(metha)acrylate, 2-hydroxypropandiol di(metha)acrylate, isopropyldiol di(metha)acrylate, isopropyleneglycol di(metha)acrylate, 2-hydroxyethyl methacrylate, phenylglycidylester acrylate, 1,6-hexanediol epoxy acrylate, Ebecyl 9695, and glycidyl (metha)acrylate.

6. The photosensitive resin composition of claim 1, wherein the photoinitiator is at least one selected from the group consisting of an acetophenone-based compound, a biimidazole-based compound, a triazine-based compound, and an oxime-based compound.

7. The photosensitive resin composition of claim 1, wherein the organic solvent is at least one selected from the group consisting of N-methyl-2-pyrrolidone, N-acetyl-2-pyrrolidone, N-benzyl-2-pyrrolidone, N,N-dimethylformamide, N,N-dimethylacetamide, dimethylsulfoxide, hexanemethylphosphortriamide, N-acetyl-∈-caprolactam, dimethylimidazolidoneimidazolidinone, diethyleneglycoldimethylether, triethyleneglycoldimethylether, γ-butyrolactone, dioxane, dioxolane, tetrahydrofuran, chloroform, and chloromethylene.

8. The photosensitive resin composition of claim 1, wherein the composition comprises, with regard to 100 parts by weight of the polyamic acid:
0.5 to 30 parts by weight of the heterocyclic amine compound;
5 to 200 parts by weight of the (metha)acrylate-based compound including one or more double bonds between carbons;
0.3 to 10 parts by weight of the photoinitiator; and
300 to 700 parts by weight of the organic solvent.

9. The photosensitive resin composition of claim 1 further comprising at least an additive selected from the group consisting of a photocrosslinking sensitizer, a curing accelerator, a phosphorus-based flame retardant, a defoaming agent, a leveling agent, and an anti-gelling agent.

10. The photosensitive resin composition of claim 1, which is used for preparing a dry film.

11. A dry film comprising a cured resin product of the photosensitive resin composition according to claim 1.

12. The dry film of claim 11, which is used for a cover film of a semiconductor device or a multilayered wiring board.

13. A multilayered print wiring board comprising the dry film of claim 11.

14. A flexible circuit board comprising the dry film of claim 11.

15. A laminate body for a semiconductor comprising the dry film of claim 11.

* * * * *